(12) United States Patent
Kido et al.

(10) Patent No.: US 6,733,553 B2
(45) Date of Patent: May 11, 2004

(54) ABRASIVE COMPOSITION FOR POLISHING SEMICONDUCTOR DEVICE AND METHOD FOR PRODUCING SEMICONDUCTOR DEVICE USING THE SAME

(75) Inventors: Takanori Kido, Nagano (JP); Fumio Tsujino, Nagano (JP)

(73) Assignee: Showa Denko Kabushiki Kaisha, Tokyo (JP)

( * ) Notice: Subject to any disclaimer, the term of this patent is extended or adjusted under 35 U.S.C. 154(b) by 19 days.

(21) Appl. No.: 09/832,793

(22) Filed: Apr. 12, 2001

(65) Prior Publication Data

US 2002/0059755 A1 May 23, 2002

Related U.S. Application Data

(60) Provisional application No. 60/269,862, filed on Feb. 21, 2001.

(30) Foreign Application Priority Data

Apr. 13, 2000 (JP) .................................. P2000-112532

(51) Int. Cl.$^7$ .............................. C09C 1/68; C09K 3/14; H01L 21/304; C09G 1/02; C09G 1/04
(52) U.S. Cl. .............................. 51/307; 51/308; 51/309; 106/3; 438/692; 438/693
(58) Field of Search ..................... 51/307, 309, 308; 106/3; 438/692, 693

(56) References Cited

U.S. PATENT DOCUMENTS

| 5,759,917 | A | | 6/1998 | Grover et al. |
| 5,772,780 | A | * | 6/1998 | Homma et al. ............... 134/7 |
| 5,783,489 | A | * | 7/1998 | Kaufman et al. ........... 438/692 |
| 6,099,604 | A | * | 8/2000 | Sandhu et al. ................ 51/307 |
| 6,132,637 | A | * | 10/2000 | Hosali et al. .............. 252/79.1 |
| 6,139,763 | A | * | 10/2000 | Ina et al. ...................... 216/89 |
| 6,299,659 | B1 | | 10/2001 | Kido et al. |
| 6,343,976 | B1 | * | 2/2002 | Yoshida et al. ............... 451/41 |
| 6,410,444 | B1 | | 6/2002 | Kido et al. |

FOREIGN PATENT DOCUMENTS

JP 7-70553 3/1995

OTHER PUBLICATIONS

Search Report and Written Opinion for Application No. 200107667–8 dated Mar. 25, 2003.

* cited by examiner

*Primary Examiner*—Michael Marcheschi
(74) *Attorney, Agent, or Firm*—Sughrue Mion, PLLC

(57) ABSTRACT

The present invention can provide an abrasive composition for polishing a semiconductor device which composition contains water, microparticles of an abrasive, and a chelating agent, wherein the abrasive is cerium oxide; the microparticles of cerium oxide have an average particle size of 0.01–1.0 μm and which composition is used for suitably forming a shallow trench isolation structure in a well-controlled manner during planarization of a semiconductor device including element-isolated structure. The invention also provides a method for producing the semiconductor device by use of the abrasive composition.

10 Claims, 1 Drawing Sheet

ABRASIVE COMPOSITION FOR POLISHING SEMICONDUCTOR DEVICE AND METHOD FOR PRODUCING SEMICONDUCTOR DEVICE USING THE SAME

CROSS REFERENCE TO RELATED APPLICATION

The present application is filed under 35 U.S.C. §111(a), and claims benefit, pursuant to 35 U.S.C. §119(e)(1), of the filing date of Provisional Application No. 60/269,862 filed Feb. 21, 2001 pursuant to 35 U.S.C. §111(b).

FIELD OF THE INVENTION

The present invention relates to an abrasive composition generally employed for polishing a semiconductor device and to a method for producing the semiconductor device using the composition.

BACKGROUND OF THE INVENTION

Recently, as a method for isolating elements in a semiconductor device, a shallow trench isolation method which enables production of semiconductor devices of high package density has become of interest. This method is a technique employed instead of a conventional local oxidation of silicon (LOCOS). Specifically, trench isolation is a method of interest in which a silicon nitride film is formed on a silicon substrate; a shallow trench is formed; an oxide film is formed on the nitride film; and the surface is planarized through CMP by use of the silicon nitride film as a stopper. The trench isolation method, being capable of advantageously providing a wide effective element area, is quite a promising technique for producing LSIs of high package-density.

When LSIs of high package-density are produced through this method in which a silicon nitride film is provided underneath the oxide film to be polished and polishing is performed by use of the silicon nitride film as a stopper, a uniform device surface can be obtained by evenly polishing off the removal amount of the surface to be planarized. Polishing can be terminated in a well-controlled manner at a point at which a predetermined removal amount has reached.

Regarding abrasive compositions suitable for such a method, Japanese Patent Application Laid-Open (kokai) No. 9-194823 discloses an abrasive composition containing abrasive particles such as silicon nitride, silicon carbide, and graphite, and Japanese Patent Application Laid-Open (kokai) No. 9-208933 discloses an abrasive composition containing silicon nitride powder and an acid such as gluconic acid.

Although these abrasive compositions provide a high polishing rate due to high-hardness abrasives incorporated therein, many scratches are formed on the polished surface by the abrasives, thereby cause problems such as deterioration of the performance of LSIs.

In addition, since the polishing index of oxide film (silicon dioxide film is typically used) with respect to silicon nitride film serving as a stopper (typically, the index is represented by "selectivity")—in other words, the rate of polishing oxide film divided by the rate of polishing silicon nitride film—attained through a conventional technique is unsatisfactory, there is demand for further elevating the index.

In view of the foregoing, the present inventors previously disclosed, in International Patent Publication WO 99/43761, an abrasive composition for polishing a semiconductor device comprising water, cerium oxide, a water-soluble organic compound having at least one functional group selected from among —COOH, —COOM$_X$ groups (M$_X$ represents an atom or a functional group capable of forming a salt through substitution by an H atom), —SO$_3$H, and —SO$_3$M$_Y$ groups (M$_Y$ represents an atom or a functional group capable of forming a salt through substitution by an H atom), the abrasive composition further containing an optional chelating agent. The inventors also proposed a method for forming an element through shallow trench isolation by use of the abrasive composition.

When such an abrasive composition as disclosed in the above patent publication is used, a high selectivity can be attained and scratches on the wafer surface can be advantageously reduced. However, washing performance of the polished wafer surface is unsatisfactorily.

U.S. Pat. No. 5,738,800 discloses a composition containing water, abrasive particles, a surfactant, and a compound which can form a complex with silicon oxide or silicon nitride, and a method for forming a shallow trench isolation structure by use of the composition. The patent publication clearly specifies that a high selectivity can be attained only when the surfactant is added and that addition of the surfactant is essential. Specifically, the employed abrasive composition contains a fluorine-containing surfactant in an amount of approximately 0.1–0.5%. However, since most surfactants exhibit a strong surface activation effect and foam-generating property, an abrasive composition containing such a surfactant is not always suited for polishing a semiconductor device.

Japanese Patent Application Laid-Open (kokai) No. 10-163140 discloses a polishing method for planarizing the semiconductor device surface including a main polishing step in which polishing is performed by use of a first polishing liquid, and a finish polishing step making use of a chelating agent.

However, the two-step polishing method attains low efficiency, leading to a problematic low production yield.

Japanese Patent Application Laid-Open (kokai) No. 7-70553 discloses a polishing liquid for polishing an aluminum-containing substrate, containing a chelating agent which can form a complex with aluminum. However, since the technique disclosed in that publication is intended for application to polishing a glass substrate or a similar substrate, the performance required of the composition is completely different from that required for forming a shallow trench isolation structure according to the present invention.

As described above, in order to form a shallow trench isolation structure, there is a strong demand for an abrasive composition attaining a high selectivity, providing few scratches on the polished surface, and readily removing abrasive particles through washing.

SUMMARY OF THE INVENTION

An object of the present invention is to provide an abrasive composition for polishing a semiconductor device, which composition can solve the aforementioned drawbacks and problems. Another object of the present invention is to provide a method for producing a semiconductor device such that the aforementioned problems can be solved.

The present inventors have conducted extensive studies in order to solve the aforementioned problems, and as a result have accomplished the present invention. Accordingly, the present invention provides the following:

(1) an abrasive composition for polishing a semiconductor device comprising water, microparticles of an abrasive, and a chelating agent, characterized in that the abrasive is cerium oxide; the microparticles of cerium oxide have an average particle size of 0.01–1.0 μm; and, when silicon nitride film and silicon oxide film, separately formed on a silicon substrate through CVD, are polished separately under identical conditions, the ratio of the rate of polishing the silicon nitride film to the rate of polishing the silicon oxide film is 10 or more;

(2) an abrasive composition for polishing a semiconductor device as described in (1), wherein the abrasive includes cerium oxide microparticles and additional microparticles for polishing;

(3) an abrasive composition for polishing a semiconductor device as described in (2), wherein the additional abrasive microparticles are formed of at least one species selected from the group consisting of aluminum oxide, zirconium oxide, silicon dioxide, titanium dioxide, manganese dioxide, dimanganese trioxide, chromium oxide, iron oxide, tin oxide, zinc oxide, alumina-magnesia spinel, mullite, zircon, aluminum hydroxide, calcium hydroxide, magnesium hydroxide, silicon nitride, titanium nitride, boron nitride, silicon carbide, titanium carbide, and diamond;

(4) an abrasive composition for polishing a semiconductor device as described in (1), wherein the concentration of said cerium oxide is 0.1–10 mass % and the chelating agent is added at a mass ratio of 0.01–10 based on the mass of said cerium oxide;

(5) an abrasive composition for polishing a semiconductor device as described in (2), wherein the total concentration of said cerium oxide microparticles and the additional microparticles for polishing is 0.1–10 mass % and the chelating agent is added at a mass ratio of 0.01–10 based on the mass of the sum of microparticles;

(6) an abrasive composition for polishing a semiconductor device as described in (1) or (2), wherein the chelating agent is at least one compound selected from the group consisting of ethylenediaminetetraacetic acid (EDTA), cyclohexanediaminetetraacetic acid (CyDTA), nitrilotriacetic acid (NTA), hydroxyethylethylenediaminetriacetic acid (HEDTA), diethylenetriaminepentaacetic acid (DTPA), triethylenetetraminehexaacetic acid (TTHA), L-glutaminediacetic acid (GLDA), aminotri(methylenephosphonic acid), 1-hydroxyethylidene-1,1-diphosphonic acid, ethylenediaminetetra(methylenephosphonic acid), diethylenetriaminepenta(methylenephosphonic acid), β-alaninediacetic acid (ADA), α-alaninediacetic acid (α-ADA), asparaginediacetic acid (ASDA), ethylenediaminedisuccinic acid (EDDS), iminodiacetic acid (IDA), hydroxyethyliminodiacetic acid (HEIDA), and 1,3-propanediaminetetraacetic acid (1,3-PDTA), or a salt thereof;

(7) an abrasive composition for polishing a semiconductor device as described in (1), further comprising a dispersant having a concentration of 0.08 mass % or less;

(8) an abrasive composition for polishing a semiconductor device as described in (1), further comprising a dispersant, the dispersant containing a poly(acrylic acid) moiety or a poly(methacrylic acid) moiety, and the concentration of the dispersant being 0.08 mass % or less;

(9) an abrasive composition for polishing a semiconductor device as described in (1) or (7), wherein the abrasive composition for polishing a semiconductor device contains, as an impurity other than abrasive material microparticles components, at least one element selected from the group consisting of Mg, Al, K, Ca, Fe, Ni, Cu, Mn, Th, and U at a concentration, for each element, of 30 ppm or less;

(10) cerium oxide microparticles for use in an abrasive composition for polishing a semiconductor device as described in (1) or (7), characterized by having a purity of 99.9 mass % or more and containing, as an impurity, at least one element selected from the group consisting of Mg, Al, K, Ca, Fe, Ni, Cu, Mn, Th, and U at a concentration of 30 ppm or less;

(11) a method for producing a semiconductor device comprising forming a silicon nitride film on a semiconductor substrate; subsequently, selectively removing a part of the silicon nitride film, to thereby develop the semiconductor substrate; subsequently, etching the semiconductor substrate by use of the silicon nitride film as a mask, to thereby form a trench; depositing a silicon oxide film on the silicon nitride film and on the semiconductor substrate, to thereby completely bury the trench with the silicon oxide film; and planarization-polishing the silicon oxide film by use of the silicon nitride film as a stopper, to thereby selectively leave said silicon oxide in the trench, wherein the planarization-polishing is performed by use of an abrasive composition for polishing a semiconductor device as recited in (1) or (2); and

(12) a semiconductor substrate having an element-isolated structure produced through the following steps: forming a silicon nitride film on a semiconductor substrate; subsequently, selectively removing a part of the silicon nitride film, to thereby develop the semiconductor substrate; subsequently, etching the semiconductor substrate by use of the silicon nitride film as a mask, to thereby form a trench; depositing a silicon oxide film on the silicon nitride film and on the semiconductor substrate, to thereby completely bury the trench with the silicon oxide film; and planarization-polishing the silicon oxide film by use of the silicon nitride film as a stopper, to thereby selectively leave said silicon oxide in the trench, wherein the planarization-polishing is performed by use of an abrasive composition for polishing a semiconductor device as recited in (1) or (2).

According to the method of the present invention, scratches on the polished surface can be reduced, and a shallow trench isolation structure can suitably be formed in a well-controlled manner. In addition, abrasive particles can readily be removed from the polished wafer through washing.

DETAILED DESCRIPTION OF THE INVENTION

Figure 1:
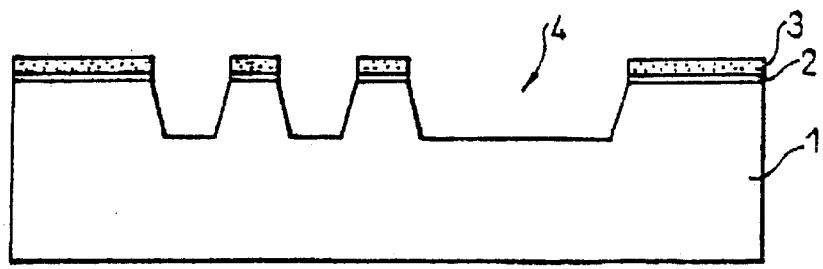
FIGS. 1–4 are cross-sectional representations of a semiconductor device which sequentially show the procedure for forming a shallow trench isolation structure.

The abrasive composition of the present invention for polishing a semiconductor device will next be described.

When an element-isolated structure is formed through the shallow trench isolation method, the surface of a substrate having an element-isolated structure (e.g., broadly referred to as a semiconductor device) must be planarized. In order to meet this requirement, the present invention provides an abrasive composition for polishing a semiconductor device, which composition can effectively be used for forming such an element-isolated structure.

The cerium oxide microparticles used in the abrasive composition of the present invention are preferably formed of cerium oxide of high purity. For example, the purity is 99 mass % or higher, more preferably 99.5 mass % or higher, particularly preferably 99.9 mass % or higher. When the purity is low, impurity elements detrimental to semiconductor characteristics are difficult to remove from the surface of a semiconductor device, even though the polished semiconductor device is washed. Thus, the number of defective products increases, resulting in an undesired low production yield.

When cerium oxide microparticles are formed of the aforementioned high-purity (e.g., 99.9 mass % or higher) cerium oxide (see Example 1), the cerium oxide microparticles contain Mg, Al, K, Ca, Fe, Ni, Cu, Mn, Th, and U at a concentration, for each element, as low as 30 ppm or less, preferably 10 ppm or less, more preferably 3 ppm or less. When the concentration of any of these elements is in excess of 30 ppm, the number of defective products increases as described above, resulting in an undesirably low production yield.

When such cerium oxide serves as the abrasive microparticles for preparing the abrasive composition for polishing a semiconductor device, which composition comprises water, abrasive microparticles, and a chelating agent, there can be provided an abrasive composition for polishing a semiconductor device which composition may contain, in addition to components of the abrasive microparticles, at least one impurity element selected from the group consisting of Mg, Al, K, Ca, Fe, Ni, Cu, Mn, Th, and U at a concentration, for each element, as low as 20 ppm or less, preferably 10 ppm or less, more preferably 1 ppm or less.

The cerium oxide microparticles preferably have an average particle size ($d_{50}$) of 0.01 μm to 1.0 μm, more preferably 0.1 μm to 0.5 μm. When cerium oxide microparticles having a $d_{50}$ of less than 0.01 μm are used, the rate of polishing an oxide film (usually silicon dioxide film) formed on a semiconductor device decreases, whereas when the $d_{50}$ is in excess of 1.0 μm, the polished surface readily receives micro-scratches. Both cases are disadvantageous. The average particle size ($d_{50}$) as used herein is preferably measured through a dynamic light scattering method.

The cerium oxide microparticles preferably have a primary particle size of 0.005 μm to 0.5 μm, more preferably 0.02 μm to 0.2 μm. When the primary particle size is less than 0.005 μm, the rate of polishing oxide film considerably decreases, failing to attain a high selectivity, whereas when the primary particle size is in excess of 0.5 μm, the polished surface readily receives micro-scratches. Both cases are disadvantageous. The primary particle size as used herein is preferably a value calculated from the specific surface area determined through the BET method, assuming that the particles are spherical.

The cerium oxide (microparticles) concentration in the abrasive composition of the present invention varies depending on the polishing conditions, such as process pressure during polishing. However, the concentration is preferably 0.1–10 mass %, more preferably 0.3–5 mass %. When the concentration is less than 0.1 mass %, the rate of polishing an oxide film decreases, whereas when the concentration is in excess of 10 mass %, the effect; i.e., an increase in rate of polishing oxide film, cannot be attained commensurate with an increase in amount of cerium oxide. This case is undesirable in terms of cost.

The cerium oxide concentration as defined herein refers to the cerium oxide concentration in the abrasive composition during use.

The chelating agent used in the abrasive composition of the present invention will next.be described.

The chelating agent may be a known chelating agent, with no particular limitations placed on the chemical structure thereof. However, specific examples of preferred chelating agents according to the present invention include ethylenediaminetetraacetic acid (EDTA), cyclohexanediaminetetraacetic acid (CyDTA), nitrilotriacetic acid (NTA), hydroxyethylethylenediaminetriacetic acid (HEDTA), diethylenetriaminepentaacetic acid (DTPA), triethylenetetraminehexaacetic acid (TTHA), L-glutaminediacetic acid (GLDA), aminotri(methylenephosphonic acid), 1-hydroxyethylidene-1,1-diphosphonic acid, ethylenediaminetetra(methylenephosphonic acid), diethylenetriaminepenta(methylenephosphonic acid), β-alaninediacetic acid (ADA), α-alaninediacetic acid (α-ADA), asparaginediacetic acid (ASDA), ethylenediaminedisuccinic acid (EDDS), iminodiacetic acid (IDA), hydroxyethyliminodiacetic acid (HEIDA), and 1,3-propanediaminetetraacetic acid (1,3-PDTA).

Generally, the chelating agent is used in the form of a free acid or a salt. However, addition of the free acid at a high concentration is limited, due to poor solubility thereof in water. Thus, the chelating agent is preferably used in the form of a salt. Although no particular limitation is imposed on the salt species in the present invention, a quaternary ammonium salt is preferably used in the case in which the characteristics of LSIs are possibly affected.

Specific examples of preferred salts include lithium salts, sodium salts, potassium salts, and cesium salts. Examples of preferred amines that can form the aforementioned quaternary ammonium salt include ammonia; primary, secondary, and tertiary amines having a C1–C10, linear or branched, saturated or unsaturated alkyl group; primary, secondary, and tertiary amines having at least one C6–C10 aromatic group; and cyclic amines such as piperidine and piperazine.

The amount of the chelating agent to be added varies depending on the cerium oxide microparticle concentration in the composition of the present invention, on the pH of the composition, and on polishing conditions such as process pressure during polishing. However, typically, the mass ratio of the chelating agent to cerium oxide is preferably 0.01–10, more preferably 0.05–5, further preferably 0.1–3. When the mass ratio is less than 0.01, the amount of the chelating agent adsorbed onto the silicon nitride film surface is small relative to the amounts of abrasive particles which act during polishing, forming a poor adsorption layer and attaining a poor effect of preventing direct contact between cerium oxide microparticles and the silicon nitride film. Thus, the rate of polishing silicon nitride film cannot be reduced. In contrast, when the mass ratio is in excess of 10, an effect fails to be commensurate with an increase in amount of the chelating agent, leading to a cost disadvantage.

Furthermore, the abrasive composition of the present invention may contain, in combination, an additional abrasive other than cerium oxide. In this case, the amount of the additional abrasive is 0.01–50 mass %, preferably 0.1–20 mass %, more preferably 0.5–10 mass %, based on the total amount of the abrasives. Preferably, the total microparticle concentration of cerium oxide and the additional abrasive is 0.1–10 mass % based on the mass of the composition, and the amount of a chelating agent added is 0.01–10 times the total mass of the microparticles. The average particle size of the additional abrasive other than cerium oxide is preferably 0.01–1.0 μm, more preferably 0.1 μm to 0.5 μm.

Preferably, the additional abrasive is arbitrarily selected from among compounds such as aluminum oxide, zirconium oxide, silicon dioxide, titanium dioxide, manganese dioxide, dimanganese trioxide, chromium oxide, iron oxide, tin oxide, zinc oxide, alumina-magnesia spinel, mullite, zircon, aluminum hydroxide, calcium hydroxide, magnesium hydroxide, silicon nitride, titanium nitride, boron nitride, silicon carbide, titanium carbide, and diamond.

The aforementioned abrasive composition according to the present invention may further contain a dispersant. In this case, an abrasive composition, for polishing a semiconductor device, in which the dispersant content is adjusted to 0.08 mass % or less is preferred. Known dispersants may be employed as the aforementioned dispersant. Of these, a poly(organic carboxylic acid) is preferred. Examples of such dispersants include a dispersing agent having a poly(acrylic acid) moiety or a poly(methacrylic acid) moiety. The abrasive composition of the present invention may employ the polyorganic carboxylic acid in the form of an ammonium salt or an organic quaternary ammonium (other than ammonium) salt.

The abrasive composition of the present invention provides high selectivity of the rate of polishing silicon oxide film to that of polishing silicon nitride film. The selectivity can be adjusted to 10 or higher, more preferably 30 or higher, particularly preferably 50 or higher. In addition, use of the abrasive composition of the present invention drastically reduces scratching on the polished surface, and enhances wash-out efficiency of abrasive particles remaining on the polished wafer.

The method for forming a shallow trench isolation structure in a semiconductor device by use of the abrasive composition will next be described.

The method is described with reference to the drawings. As shown in FIG. 1, a surface of a semiconductor substrate 1 made of a substance such as silicon is slightly oxidized, to thereby form a silicon oxide film 2, and, subsequently, a silicon nitride film 3 having a thickness of; e.g., 200 nm, is deposited thereon through a technique such as CVD. Next, a recess 4 having a width of; e.g., 500–5000 nm, is formed in a predetermined position of the silicon nitride film 3 where a trench is to be formed, through a technique such as photolithography making use of a photoresist.

Subsequently, the semiconductor substrate 1 is selectively etched by utilizing as a mask the silicon nitride film 3 having a recess therein, to thereby form a shallow trench 4 having a depth of, e.g., 500 nm.

Figure 2:
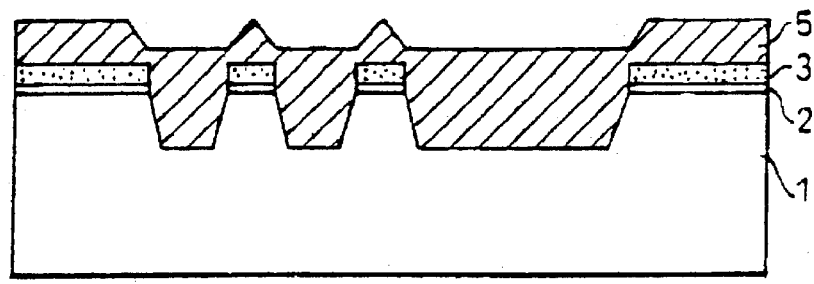

On the entire surface of the semiconductor substrate 1 coated with the silicon nitride film 3, a silicon oxide film is deposited through a technique such as bias CVD—a technique for attaining a good burying property, to thereby completely bury the trench 4 with the silicon oxide film 5 (see FIG. 2).

Figure 3:
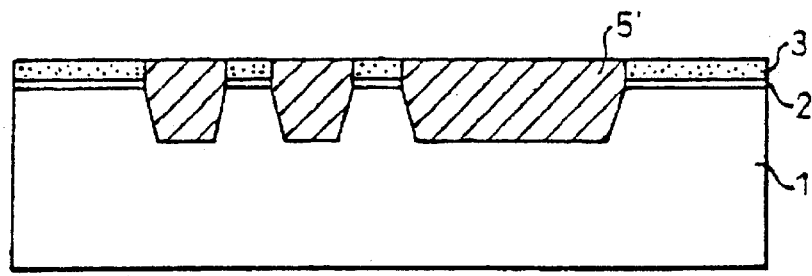
Figure 4:
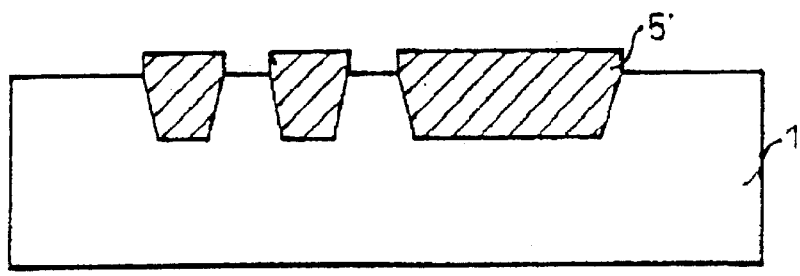

The thus-obtained surface of the silicon oxide film 5 has a recess on the buried trench 4. However, by planarization-polishing the surface making use of the abrasive composition, the surface is gradually polished, to thereby yield a planar surface. As polishing proceeds, the surface of the silicon oxide film becomes completely planar, to thereby remove the recess from the trench 4, until the polished surface reaches the surface of the silicon nitride film 3. Polishing is terminated when the surface of the silicon nitride film 3 is developed. Thus, a trench 5 for shallow trench isolation is formed as shown in FIG. 3. Although the silicon nitride film 3 itself may serve as an insulating film formed on the semiconductor, the film is typically removed as shown in FIG. 4.

In the aforementioned planarization polishing for forming a shallow trench isolation structure, a high ratio of the rate of polishing silicon oxide to that of polishing silicon nitride; i.e., a high selectivity, is required in order to effectively polish the silicon oxide film and to accurately terminate polishing when the polished surface coincides with the level of the silicon nitride film. In addition, when the planarization-polished surface is scratched, LSI characteristics may disadvantageously be impaired.

The abrasive composition of the present invention has been developed in order to provide an abrasive composition optimal for carrying out the aforementioned planarization polishing. Use of the abrasive composition of the present invention can achieve a selectivity of 10 or higher, preferably 30 or higher, more preferably 50 or higher, attaining highly controllable planarization polishing. In addition, another advantage lies in that scratches on the polished surface can be removed, and that abrasive particles remaining on the polished wafer can effectively removed by washing.

Polishing by use of the abrasive composition of the present invention can be performed through a known polishing method or a chemical mechanical polishing (CMP) method.

BEST MODES FOR CARRYING OUT THE INVENTION

The present invention will next be described in more detail by way of examples, which should not be construed as limiting the invention thereto.

EXAMPLE 1

Cerium oxide of high purity was prepared from a commercially available cerium carbonate through heat treatment. The thus-prepared cerium oxide had the following characteristics: an average particle size ($d_{50}$) of 0.2 µm; a primary particle size of 0.08 µm, and a purity of 99.9 mass % or higher (chemical analysis data: concentration of each element; i.e., Mg, Al, K, Ca, Fe, Ni, Cu, Mn, Th, or U of 3 ppm or less). Subsequently, the thus-prepared cerium oxide microparticles (1 mass %), triammonium ethylenediaminetetraacetate (EDTA.H.3($NH_4$)) (0.3 mass %), and water (balance) were mixed, to thereby prepare an abrasive composition in slurry form. In the composition, the EDTA.H.3($NH_4$) was incorporated such that the ratio by mass of EDTA.H.3($NH_4$) to cerium oxide was controlled to 0.3. The pH of the composition was 7.2. After removal of the abrasive microparticles from the slurry was complete, the remaining aqueous solution was analyzed, and the concentration of each of the impurity elements Mg, Al, K, Ca, Fe, Ni, Cu, Mn, Th, and U was found to be 0.5 ppm or less.

Subsequently, the abrasive slurry was evaluated in terms of polishing performance on silicon dioxide film and silicon nitride film, in the following manner.

[Polishing Conditions]

Material to be Polished:

(1) Silicon dioxide film (film thickness: approximately 1 µm) formed on a silicon wafer (6-inch-φ, thickness: 625 µm) through CVD; and (2) Silicon nitride film (film thickness: approximately 0.5 µm) formed on a silicon wafer (6-inch-φ, thickness: 625 µm) through CVD.

Pad: Double-layer-type polishing pad for polishing a semiconductor device (IC1000/Suba400: Product of Rodel-Nitta K.K.)

Polishing apparatus: One-side polishing machine for polishing a semiconductor device (Product of Speed- Fam Co., Ltd.: Model SH-24, surface plate diameter of 610 mm) Rotation rate of surface-plate: 70 rpm
Process pressure: 300 gf/cm$^2$
Slurry feed rate: 100 ml/min
Polishing time: 1 min

[Items and Method of Evaluation]
Polishing rate: Optical-interference-type film-thickness measurement apparatus
Scratch status: Dark-field observation under an optical microscope
(Three percent of the wafer surface was observed at a magnification of 200, and the number of detected scratches was reduced to number/cm$^2$.)
Remaining abrasive particles: Dark-field observation under an optical microscope
(Three percent of the wafer surface was observed at a magnification of 200, and the number of detected scratches was reduced to number/cm$^2$.)

The above-described polishing test was performed, and the tested wafer was washed by scrubbing with pure water, spin-dried, and evaluated. The test revealed that the rate of polishing silicon dioxide film was as high as 4340 Å/min, and the rate of polishing silicon nitride film was as considerably low as 36 Å/min. Accordingly, the selectivity is as high as 121.

In addition, no scratches were observed on either the silicon dioxide film or the silicon nitride film.

Furthermore, abrasive particles remaining on the silicon dioxide film and silicon nitride film were found to number 0.19/cm$^2$ and 0.38/cm$^2$, respectively. The results indicate that the abrasive particles were satisfactorily washed off.

EXAMPLES 2 to 8

The procedure of Example 1 was repeated, except that the cerium oxide concentration and the EDTA.H.3(NH$_4$) concentration were changed, to thereby prepare slurry samples. Each slurry sample was evaluated in a manner similar to that of Example 1. The results are shown in Table 1.

TABLE 1-1

| No. | Cerium oxide concentration (mass %) | Chelating agent (species) | Chelating agent concentration (mass %) | Mass ratio (chelating agent/ cerium oxide) | pH of slurry | Polishing rate (Å/min) SiO$_2$ film | Polishing rate (Å/min) SiN$_4$ film | Selectivity | Scratches on polished surface (number/cm$^2$) SiO$_2$ film | Scratches on polished surface (number/cm$^2$) SiN$_4$ film | Remaining abrasive particles (number/cm$^2$) SiO$_2$ film | Remaining abrasive particles (number/cm$^2$) SiN$_4$ film |
|---|---|---|---|---|---|---|---|---|---|---|---|---|
| Ex. 1 | 1 | EDTA.H.3(NH$_4$) | 0.3 | 0.3 | 7.2 | 4340 | 36 | 121 | 0 | 0 | 0.19 | 0.38 |
| Ex. 2 | 1 | EDTA.H.3(NH$_4$) | 0.1 | 0.1 | 7.3 | 4690 | 90 | 54 | 0 | 0 | 0.38 | 0.19 |
| Ex. 3 | 1 | EDTA.H.3(NH$_4$) | 0.5 | 0.5 | 7.2 | 3750 | 33 | 114 | 0 | 0 | 0.00 | 0.19 |
| Ex. 4 | 0.5 | EDTA.H.3(NH$_4$) | 0.1 | 0.2 | 7.2 | 3780 | 71 | 53 | 0 | 0 | 0.38 | 0.19 |
| Ex. 5 | 5 | EDTA.H.3(NH$_4$) | 5 | 1 | 7.0 | 5710 | 100 | 57 | 0 | 0 | 0.38 | 0.38 |
| Ex. 6 | 1 | EDTA.H.3(NH$_4$) | 0.02 | 0.02 | 7.2 | 5940 | 550 | 11 | 0 | 0 | 0.56 | 0.19 |
| Ex. 7 | 0.1 | EDTA.H.3(NH$_4$) | 0.5 | 5 | 7.2 | 1240 | 22 | 56 | 0 | 0 | 0.19 | 0.00 |
| Ex. 8 | 0.2 | EDTA.H.3(NH$_4$) | 0.1 | 0.5 | 7.3 | 1100 | 28 | 39 | 0 | 0 | 0.19 | 0.00 |
| Ex. 9 | 1 | EDTA.H.3(NH$_4$) | 0.3 | 0.3 | 7.2 | 4030 | 34 | 119 | 0 | 0 | 0.19 | 0.19 |

TABLE 1-2

| No. | Cerium oxide concentration (mass %) | Chelating agent (species) | Chelating agent concentration (mass %) | Mass ratio (chelating agent/ cerium oxide) | pH of slurry | Polishing rate (Å/min) SiO$_2$ film | Polishing rate (Å/min) SiN$_4$ film | Selectivity | Scratches on polished surface (number/cm$^2$) SiO$_2$ film | Scratches on polished surface (number/cm$^2$) SiN$_4$ film | Remaining abrasive particles (number/cm$^2$) SiO$_2$ film | Remaining abrasive particles (number/cm$^2$) SiN$_4$ film |
|---|---|---|---|---|---|---|---|---|---|---|---|---|
| Ex. 10 | 1 | ADA | 0.3 | 0.3 | 7.4 | 3370 | 31 | 109 | 0 | 0 | 0.19 | 0.19 |
| Ex. 11 | 1 | NTA | 0.5 | 0.5 | 7.5 | 2880 | 32 | 90 | 0 | 0 | 0.00 | 0.19 |
| Ex. 12 | 1 | HEIDA | 0.5 | 0.5 | 7.9 | 3720 | 18 | 207 | 0 | 0 | 0.19 | 0.38 |
| Ex. 13 | 1 | ASDA | 0.5 | 0.5 | 7.6 | 3380 | 37 | 91 | 0 | 0 | 0.19 | 0.00 |
| Ex. 14 | 1 | EDDS | 0.5 | 0.5 | 7.5 | 3630 | 24 | 151 | 0 | 0 | 0.38 | 0.19 |
| Comp. Ex. 1 | 1 | — | 0 | 0 | 7.0 | 6130 | 1050 | 6 | 0 | 0 | 3.20 | 2.07 |
| Comp. Ex. 2 | 1 | EDTA.H.3(NH$_4$) | 0.3 | 0.3 | 7.2 | 5590 | 260 | 22 | 87 | 48 | 0.38 | 0.38 |
| Comp. Ex. 3 | 1 | EDTA.H.3(NH$_4$) | 0.3 | 0.3 | 7.2 | 110 | 24 | 5 | 0 | 0 | 0.56 | 0.38 |

EXAMPLE 9

A poly(acrylic acid) ammonium salt was added to the abrasive composition of Example 1, to thereby prepare a slurry having a poly(acrylic acid) ammonium salt content of 0.004 mass %. The thus-prepared slurry was evaluated in a manner similar to that of Example 1. The results are shown in Table 1.

EXAMPLE 10

The procedure of Example 1 was repeated, except that β-alaninediacetic acid (ADA) was employed as a chelating agent instead of EDTA.H/3(NH$_4$) and aqueous ammonia was added so as to adjust the pH of the slurry to fall in a nearly neutral region, to thereby prepare a slurry similar to that obtained in Example 1. The thus-prepared slurry was evaluated in a manner similar to that of Example 1. The results are shown in Table 1.

EXAMPLE 11

The procedure of Example 1 was repeated, except that nitrilotriacetic acid (NTA) was employed as a chelating agent instead of EDTA.H/3(NH$_4$); the chelating agent concentration was adjusted to 0.5 mass %; and aqueous ammonia was added so as to adjust the pH of the slurry to fall in a nearly neutral region, to thereby prepare a slurry similar to that obtained in Example 1. The thus-prepared slurry was evaluated in a manner similar to that of Example 1. The results are shown in Table 1.

EXAMPLE 12

The procedure of Example 1 was repeated, except that hydroxyethyliminodiacetic acid (HEIDA) was employed as a chelating agent instead of EDTA.H/3(NH$_4$); the chelating agent concentration was adjusted to 0.5 mass %; and aqueous ammonia was added so as to adjust the pH of the slurry to fall in a nearly neutral region, to thereby prepare a slurry similar to that obtained in Example 1. The thus-prepared slurry was evaluated in a manner similar to that of Example 1. The results are shown in Table 1.

EXAMPLE 13

The procedure of Example 1 was repeated, except that asparaginediacetic acid (ASDA) was employed as a chelating agent instead of EDTA.H/3(NH$_4$); the chelating agent concentration was adjusted to 0.5 mass %; and aqueous ammonia was added so as to adjust the pH of the slurry to fall in a nearly neutral region, to thereby prepare a slurry similar to that obtained in Example 1. The thus-prepared slurry was evaluated in a manner similar to that of Example 1. The results are shown in Table 1.

EXAMPLE 14

The procedure of Example 1 was repeated, except that ethylenediaminedisuccinic acid (EDDS) was employed as a chelating agent instead of EDTA.H/3(NH$_4$); the chelating agent concentration was adjusted to 0.5 mass %; and aqueous ammonia was added so as to adjust the pH of the slurry to fall in a nearly neutral region, to thereby prepare a slurry similar to that obtained in Example 1. The thus-prepared slurry was evaluated in a manner similar to that of Example 1. The results are shown in Table 1.

COMPARATIVE EXAMPLE 1

The procedure of Example 1 was repeated, except that no EDTA.H.3(NH$_4$) was added, to thereby prepare a slurry. The slurry was evaluated in a manner similar to that of Example 1. The results are shown in Table 1.

When the slurry contained no chelating agent, the selectivity was low and the abrasive particles were removed insufficiently from the polished wafer surface through washing.

COMPARATIVE EXAMPLE 2

The procedure of Example 1 was repeated, except that cerium oxide particles having an average particle size ($d_{50}$) of 1.9 μm and a primary particle size of 0.13 μm were used, to thereby prepare a slurry. The slurry was evaluated in a manner similar to that of Example 1. The results are shown in Table 1.

When cerium oxide particles had an average particle size in excess of 1.0 μm, a large number of scratches were generated on the wafer surface.

COMPARATIVE EXAMPLE 3

The procedure described in Example 1 was repeated, except that cerium oxide particles having an average particle size ($d_{50}$) of 0.008 μm and a primary particle size of 0.004 μm were used, to thereby prepare a slurry. The slurry was evaluated in a manner similar to that of Example 1. The results are shown in Table 1.

When cerium oxide had an average particle size of less than 0.01 μm, the rate of polishing silicon oxide film was considerably low, which is not suitable for practical use.

INDUSTRIAL APPLICATION

The abrasive composition of the present invention can enhance the rate of polishing oxide film (silicon dioxide) and the selectivity of silicon oxide film to silicon nitride film in terms of polishing rate, attaining highly controllable planarization polishing. In addition, the abrasive composition generates fewer scratches on the polished surface, and abrasive particles remaining on the polished wafer can readily be removed by washing. Therefore, the abrasive composition of the present invention can preferably be used for polishing of a semiconductor device; i.e., for polishing of oxide film (usually silicon dioxide) to which silicon nitride film serving as a stopper film is attached.

What is claimed is:

1. An abrasive composition for polishing a semiconductor device consisting essentially of water, microparticles of an abrasive, and a chelating agent, wherein the abrasive is cerium oxide; the microparticles of cerium oxide have an average particle size of 0.01–1.0 μm; and, when silicon nitride film and silicon oxide film, separately formed on a silicon substrate through CVD, are polished separately under identical conditions, the ratio of the rate of polishing the silicon nitride film to the rate of polishing the silicon oxide film is 10 or more.

2. An abrasive composition for polishing a semiconductor device as described in claim 1, wherein the abrasive includes cerium oxide microparticles and additional microparticles for polishing.

3. An abrasive composition for polishing a semiconductor device as described in claim 2, wherein the additional abrasive microparticles are formed of at least one species selected from the group consisting of aluminum oxide, zirconium oxide, silicon dioxide, titanium dioxide, manganese dioxide, dimanganese trioxide, chromium oxide, iron oxide, tin oxide, zinc oxide, alumina-magnesia spinel, mullite, zircon, aluminum hydroxide, calcium hydroxide, magnesium hydroxide, silicon nitride, titanium nitride, boron nitride, silicon carbide, titanium carbide, and diamond.

4. An abrasive composition for polishing a semiconductor device as described in claim 1, wherein the concentration of said cerium oxide is 0.1–10 mass % and the chelating agent is added at a mass ratio of 0.01–10 based on the mass of said cerium oxide.

5. An abrasive composition for polishing a semiconductor device as described in claim 2, wherein the total concentration of said cerium oxide microparticles and the additional microparticles for polishing is 0.1–10 mass % and the chelating agent is added at a mass ratio of 0.01–10 based on the mass of the sum of microparticles.

6. An abrasive composition for polishing a semiconductor device as described in claim 1 or 2, wherein the chelating agent is at least one compound selected from the group consisting of ethylenediaminetetraacetic acid (EDTA), cyclohexanediarninetetraacetic acid (CyDTA), nitrilotriacetic acid (NTA), hydroxyethylethylenediaminetriacetic acid (HEDTA), diethylenetriaminepentaacetic acid (DTPA), triethylenetetraminehexaacetic acid (TTHA), L-glutaminediacetic acid (GLDA), aminotri (methylenephosphonic acid), 1-hydroxyethylidene-1,1-diphosphonic acid, ethylenediaminetetra (methylenephosphonic acid), diethylenetriarninepenta (methylenephosphonic acid), β-alaninediacetic acid (ADA), β-alaninediacetic acid (β-ADA), asparaginediacetic acid (ASDA), ethylenediaminedisuccinic acid (EDDS), iminodiacetic acid (IDA), hydroxyethyliminodiacetic acid (HEIDA), and 1,3-propanediaminetetraacetic acid (1,3-PDTA), or a salt thereof.

7. An abrasive composition for polishing a semiconductor device as described in claim 1, further consisting essentially of a dispersant having a concentration of 0.08 mass % or less.

8. An abrasive composition for polishing a semiconductor device as claimed in claim 1, further consisiting essentially of a dispersant, the dispersant containing a poly(acrylic acid) moiety or a poly(methacrylic acid) moiety, and the concentration of the dispersant being 0.08 mass % or less.

9. An abrasive composition for polishing a semiconductor device as described in claim 1 or 7, wherein the abrasive composition for polishing a semiconductor device contains, as an impurity other than abrasive material microparticles components, at least one element selected from the group consisting of Mg, Al, K, Ca, Fe, Ni, Cu, Mn, Th and U at a concentration, for each element, of 30 ppm or less.

10. A method for producing a semiconductor device comprising forming a silicon nitride film on a semiconductor substrate; subsequently, selectively removing a part of the silicon nitride film, to thereby develop the semiconductor substrate; subsequently, etching the semiconductor substrate by use of the silicon nitride film as a mask, to thereby form a trench; depositing a silicon oxide film on the silicon nitride film and on the semiconductor substrate, to thereby completely bury the trench with the silicon oxide film; and planarization-polishing the silicon oxide film by use of the silicon nitride film as a stopper, to thereby selectively leave said silicon oxide in the trench, wherein the planarization-polishing is performed by use of an abrasive composition for polishing a semiconductor device as recited in claim 1 or 2.

* * * * *